United States Patent
Yuan

(10) Patent No.: US 12,095,428 B2
(45) Date of Patent: Sep. 17, 2024

(54) OPTICAL AMPLIFYING MODULE AND MANUFACTURING METHOD THEREOF

(71) Applicant: Chih Hsien Yuan, Taoyuan (TW)

(72) Inventor: Chih Hsien Yuan, Taoyuan (TW)

( * ) Notice: Subject to any disclaimer, the term of this patent is extended or adjusted under 35 U.S.C. 154(b) by 492 days.

(21) Appl. No.: 17/584,441

(22) Filed: Jan. 26, 2022

(65) Prior Publication Data

US 2022/0247366 A1 Aug. 4, 2022

(30) Foreign Application Priority Data

Feb. 2, 2021 (TW) ................................. 110103734

(51) Int. Cl.
  *H03F 3/21* (2006.01)
  *H03F 1/02* (2006.01)
  *H03F 3/24* (2006.01)

(52) U.S. Cl.
  CPC ............ *H03F 3/211* (2013.01); *H03F 1/0211* (2013.01); *H03F 3/24* (2013.01)

(58) Field of Classification Search
  CPC ........... H03F 3/211; H03F 1/0211; H03F 3/24
  USPC ..................................................... 330/124 R
  See application file for complete search history.

(56) References Cited

U.S. PATENT DOCUMENTS

| 8,514,165 | B2 * | 8/2013 | Yoshida | G09G 3/3648 |
| | | | | 250/214 A |
| 2014/0175435 | A1 * | 6/2014 | Yamazaki | H01L 29/78696 |
| | | | | 257/43 |
| 2019/0035937 | A1 * | 1/2019 | Yamazaki | H01L 29/7869 |
| 2019/0305034 | A1 * | 10/2019 | Hsieh | G06F 3/044 |
| 2023/0144025 | A1 * | 5/2023 | Choi | H01L 27/156 |
| | | | | 257/89 |

FOREIGN PATENT DOCUMENTS

JP 2020116358 A * 8/2020

* cited by examiner

*Primary Examiner* — Hafizur Rahman
(74) *Attorney, Agent, or Firm* — WPAT, P.C.

(57) ABSTRACT

An optical amplifying module and a manufacturing method are provided. The optical amplifying module includes a current amplifying element, a light emitting element and a light receiving element. A main substrate of the current amplifying element has a first surface and a second surface, which are opposed to each other. Moreover, plural first main electrodes are installed on the first surface, and plural second main electrodes are installed on the second surface. The light emitting element is installed beside the first surface of the current amplifying element. The light emitting units of the light emitting element are electrically coupled with the corresponding first main electrodes. The light receiving element is installed beside the second surface of the current amplifying element. The light receiving units of the light receiving element are electrically coupled with the corresponding second main electrodes.

12 Claims, 5 Drawing Sheets

OPTICAL AMPLIFYING MODULE AND MANUFACTURING METHOD THEREOF

FIELD OF THE INVENTION

The present invention relates to an optical conversion device, and more particularly to an optical amplifying module with an image displaying function.

BACKGROUND OF THE INVENTION

The night vision function is often used for military operations or surveillance purposes. Conventionally, according to the imaging technologies, the night vision devices can be divided into two types, including a low-light level night vision device and an infrared light night vision device.

For example, the infrared light night vision devices can be operated in a passive night vision mode or an active night vision mode. In the passive night vision mode, the infrared light night vision device detects the infrared light in the surrounding environment or detects the infrared light radiated by the target object. Consequently, an image can be formed. In the active night vision mode, the infrared light night vision device actively emits the infrared light to the target object to be observed, and then the infrared light reflected by the target object is converted into the visible light by the infrared light night vision device. On the other hand, the low-light level night vision device mainly uses an image intensifier to strengthen the weak light. Consequently, the image can be clearly observed by the user.

However, the process of manufacturing the display module of the existing night vision device is relatively complicated. Therefore, it is an useful achievement to provide an optical amplifying module with an image displaying function and a simplified manufacturing process in order to overcome the drawbacks of the conventional technology.

SUMMARY OF THE INVENTION

An object of the present invention provides an optical amplifying module. The process of manufacturing the optical amplifying module is simplified. In addition, the optical amplifying module has an image displaying function.

In accordance with an aspect of the present invention, a manufacturing method of an optical amplifying module is provided. The manufacturing method includes the following steps. In a step (a), a current amplifying element is provided. A main substrate of the current amplifying element has a first surface and a second surface, which are opposed to each other. Plural first main electrodes, plural transistors and at least one first minor electrode are installed on the first surface. Each transistor is located beside the corresponding first main electrode. Each transistor is electrically connected with the corresponding first main electrode. Plural second main electrodes and at least one second minor electrode are installed on the second surface. Each transistor is electrically connected with the corresponding second main electrode through a corresponding inner conductive line. In a step (b), a light emitting element is provided. The light emitting element includes a first light-transmissible electrode and plural light emitting units corresponding to the plural first main electrodes. Each light emitting unit includes a first connection electrode. In a step (c), the light emitting element is installed beside the first surface of the current amplifying element. The plural light emitting units are electrically coupled with the corresponding first main electrodes through the corresponding first connection electrodes. The first light-transmissible electrode is electrically coupled with the at least one first minor electrode. In a step (d), a light receiving element is provided. The light receiving element includes a second light-transmissible electrode and plural light receiving units corresponding to the plural second main electrodes. Each light emitting receiving unit includes a second connection electrode. In a step (e), the light receiving element is installed beside the second surface of the current amplifying element. The plural light receiving units are electrically coupled with the corresponding second main electrodes through the corresponding second connection electrodes. The second light-transmissible electrode is electrically coupled with the at least one second minor electrode.

In the step (b), the light emitting element includes a first light-transmissible substrate, the first light-transmissible electrode and the plural light emitting units. The first light-transmissible substrate has a third surface and a fourth surface, which are opposed to each other. The first light-transmissible electrode is formed on the third surface. The plural light emitting units are formed on the fourth surface. Each first connection electrode is formed on a surface of the corresponding light emitting unit away from the first light-transmissible substrate.

In an embodiment, the first light-transmissible electrode is made of indium tin oxide, indium zinc oxide, aluminum zinc oxide, zinc oxide or tin oxide, the light emitting unit is made of silicon carbide, aluminum oxide, gallium arsenide, gallium phosphide, indium phosphide, gallium nitride or aluminum gallium indium phosphide, and the first connection electrode is made of bismuth, tin, lead, cadmium, nickel, aluminum, silver, gold, metal oxide or organic conductive material.

In the step (d), the light receiving element includes a second light-transmissible substrate, the second light-transmissible electrode and the plural light receiving units. The second light-transmissible substrate has a fifth surface and a sixth surface, which are opposed to each other. The second light-transmissible electrode is formed on the fifth surface. The plural light receiving units are formed on the sixth surface. Each second connection electrode is formed on a surface of the corresponding light receiving unit away from the second light-transmissible substrate.

In an embodiment, the second light-transmissible electrode is made of indium tin oxide, indium zinc oxide, aluminum zinc oxide, zinc oxide or tin oxide, the light receiving unit is made of silicon, gallium arsenide, germanium, lead sulfide or indium gallium arsenide, and the second connection electrode is made of bismuth, tin, lead, cadmium, nickel, aluminum, silver, gold, metal oxide or organic conductive material.

In the step (c), the first light-transmissible electrode is electrically coupled with the at least one first minor electrode through at least one first conductive wire.

In the step (e), the second light-transmissible electrode is electrically coupled with the at least one second minor electrode through at least one second conductive wire.

In accordance with another aspect of the present invention, an optical amplifying module is provided. The optical amplifying module includes a current amplifying element, a light emitting element and a light receiving element. A main substrate of the current amplifying element has a first surface and a second surface, which are opposed to each other. Plural first main electrodes, plural transistors and at least one first minor electrode are installed on the first surface. Each transistor is located beside the corresponding first main electrode. Each transistor is electrically connected with the corresponding first main electrode. Plural second main electrodes and at least one second minor electrode are installed on the second surface. Each transistor is electrically connected with the corresponding second main electrode through a corresponding inner conductive line. The light emitting element is installed beside the first surface of the current amplifying element. The light emitting element includes a first light-transmissible electrode and plural light emitting units corresponding to the plural first main electrodes. Each light emitting unit includes a first connection electrode. The plural light emitting units are electrically coupled with the corresponding first main electrodes through the corresponding first connection electrodes. The first light-transmissible electrode is electrically coupled with the at least one first minor electrode through at least one first conductive wire. The light receiving element is installed beside the second surface of the current amplifying element. The light receiving element includes a second light-transmissible electrode and plural light receiving units corresponding to the plural second main electrodes. Each light emitting receiving unit includes a second connection electrode. The plural light receiving units are electrically coupled with the corresponding second main electrodes through the corresponding second connection electrodes. The second light-transmissible electrode is electrically coupled with the at least one second minor electrode through at least one second conductive wire.

In an embodiment, the light emitting element includes a first light-transmissible substrate, the first light-transmissible electrode and the plural light emitting units. The first light-transmissible substrate has a third surface and a fourth surface, which are opposed to each other. The first light-transmissible electrode is formed on the third surface. The plural light emitting units are formed on the fourth surface. Each first connection electrode is formed on a surface of the corresponding light emitting unit away from the first light-transmissible substrate.

In an embodiment, the first light-transmissible electrode is made of indium tin oxide, indium zinc oxide, aluminum zinc oxide, zinc oxide or tin oxide, the light emitting unit is made of silicon carbide, aluminum oxide, gallium arsenide, gallium phosphide, indium phosphide, gallium nitride or aluminum gallium indium phosphide, and the first connection electrode is made of bismuth, tin, lead, cadmium, nickel, aluminum, silver, gold, metal oxide or organic conductive material.

In an embodiment, the light receiving element includes a second light-transmissible substrate, the second light-transmissible electrode and the plural light receiving units. The second light-transmissible substrate has a fifth surface and a sixth surface, which are opposed to each other. The second light-transmissible electrode is formed on the fifth surface. The plural light receiving units are formed on the sixth surface. Each second connection electrode is formed on a surface of the corresponding light receiving unit away from the second light-transmissible substrate.

In an embodiment, the second light-transmissible electrode is made of indium tin oxide, indium zinc oxide, aluminum zinc oxide, zinc oxide or tin oxide, the light receiving unit is made of silicon, gallium arsenide, germanium, lead sulfide or indium gallium arsenide, and the second connection electrode is made of bismuth, tin, lead, cadmium, nickel, aluminum, silver, gold, metal oxide or organic conductive material.

The optical amplifying module of the present invention is advantageous over the conventional optical amplifying module. The process of manufacturing the optical amplifying module is simplified. The yield of the optical amplifying module is enhanced. In addition, the optical amplifying module has the image displaying function.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides an optical amplifying module and a manufacturing method of the optical amplifying module. The optical amplifying module is manufactured by using optoelectronic semiconductor manufacturing processes.

Figure 1:
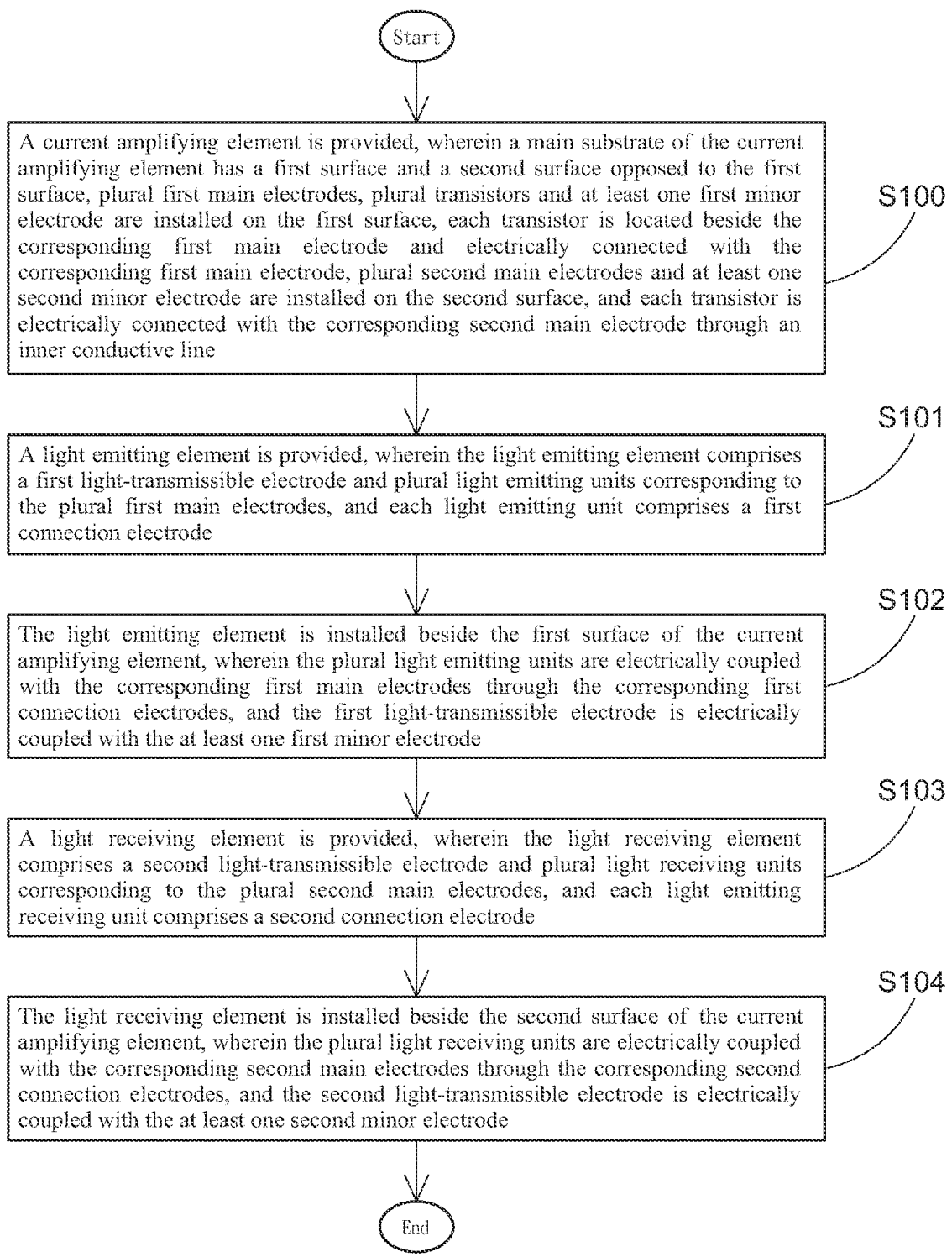
FIG. 1 is a flowchart illustrating a method for manufacturing an optical amplifying module according to an embodiment of the present invention.
Figure 2:
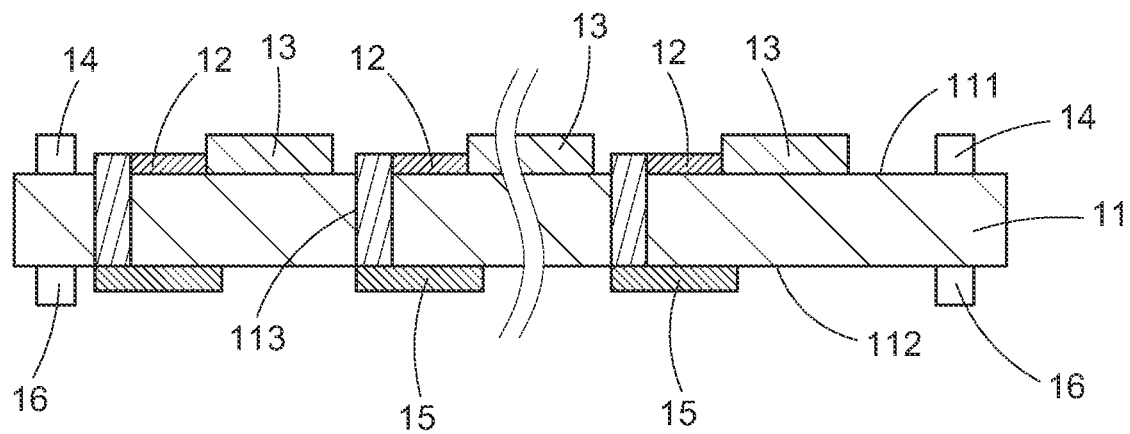
FIG. 2 is a schematic cross-sectional view illustrating a current amplifying element of the optical amplifying module according to the embodiment of the present invention.
Figure 3:
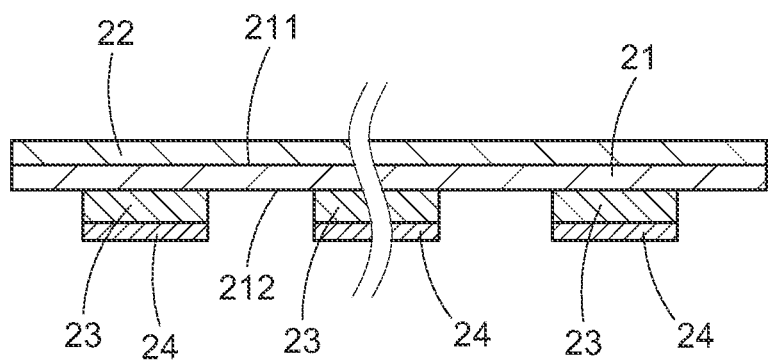
FIG. 3 is a schematic cross-sectional view illustrating a light emitting element of the optical amplifying module according to the embodiment of the present invention.
Figure 4:
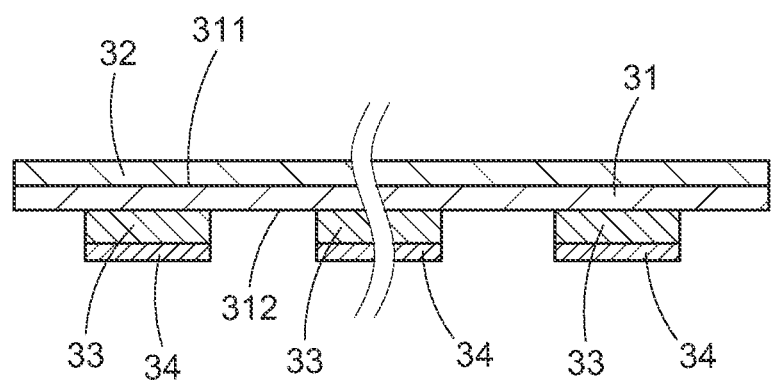
FIG. 4 is a schematic cross-sectional view illustrating a light receiving element of the optical amplifying module according to the embodiment of the present invention.
Figure 5:
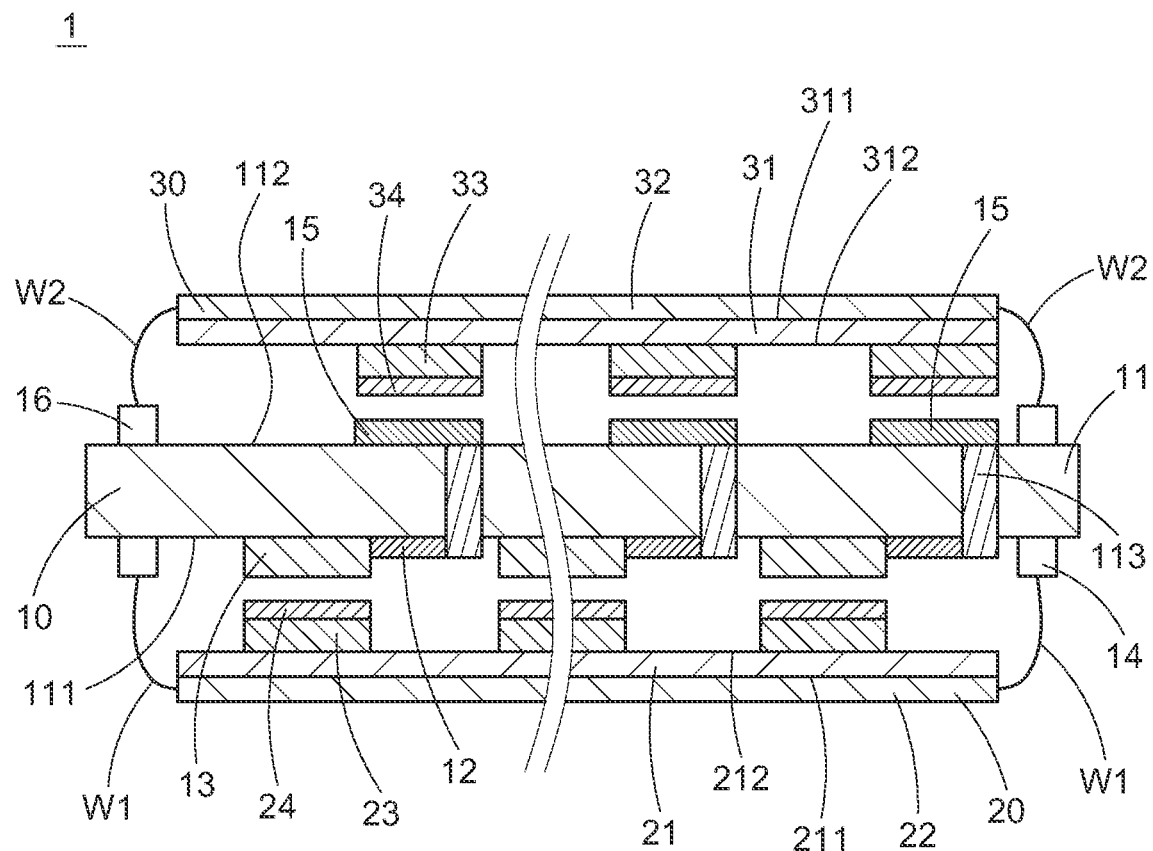
FIG. 5 is a schematic cross-sectional view illustrating the optical amplifying module according to the embodiment of the present invention.

Please refer to FIGS. 1, 2, 3, 4 and 5. FIG. 1 is a flowchart illustrating a method for manufacturing an optical amplifying module according to an embodiment of the present invention. FIG. 2 is a schematic cross-sectional view illustrating a current amplifying element of the optical amplifying module according to the embodiment of the present invention. FIG. 3 is a schematic cross-sectional view illustrating a light emitting element of the optical amplifying module according to the embodiment of the present invention. FIG. 4 is a schematic cross-sectional view illustrating a light receiving element of the optical amplifying module according to the embodiment of the present invention. FIG. 5 is a schematic cross-sectional view illustrating the optical amplifying module according to the embodiment of the present invention.

Please refer to the step S100 and FIG. 2. Firstly, a current amplifying element 10 is provided. A main substrate 11 of the current amplifying element 10 has a first surface 111 and a second surface 112. The first surface 111 and the second surface 112 are opposed to each other. Moreover, plural first main electrodes 13, plural transistors 12 and at least one first minor electrode 14 are installed on the first surface 111 of the main substrate 11. Each transistor 12 is located beside the corresponding first main electrode 13. In addition, each transistor 12 is electrically connected with the corresponding first main electrode 13. Moreover, plural second main electrodes 15 and at least one second minor electrode 16 are installed on the second surface 112 of the main substrate 11. Each transistor 12 is electrically connected with the corresponding second main electrode 15 through a corresponding inner conductive line 113. In an embodiment, the transistor 12 includes logic gates, current amplifier circuits (not shown), or the combination thereof. The main substrate 11 is a non-transparent substrate. Consequently, the light transmittance is very low or nearly zero.

In the above embodiment, two first minor electrodes 14 and two second minor electrodes 16 are respectively installed on the outer sides of the first surface 111 and the second surface 112 of the main substrate 11. It is noted that the numbers of the at least one first minor electrode 14 and the at least one second minor electrode 16 are not restricted. For example, in another embodiment, the main substrate 11 is equipped with a single first minor electrode 14 and a single second minor electrode 16.

Please refer to the step S101 and FIG. 3. Then, a light emitting element 20 is provided. The light emitting element 20 comprises a first light-transmissible electrode 22 and plural light emitting units 23 corresponding to the plural first main electrodes 13. Each light emitting unit 23 comprises a first connection electrode 24. In this embodiment, the light emitting element 20 comprises a first light-transmissible substrate 21, the first light-transmissible electrode 22, the plural light emitting units 23 and the plural first connection electrodes 24. The first light-transmissible substrate 21 has a third surface 211 and a fourth surface 212. The third surface 211 and the fourth surface 212 are opposed to each other. The first light-transmissible electrode 22 is a multi-layered structure. The first light-transmissible electrode 22 is formed on the third surface 211 of the first light-transmissible substrate 21. The light emitting units 23 are formed on the fourth surface 212 of the first light-transmissible substrate 21. Each first connection electrode 24 is formed on a surface of the corresponding light emitting unit 23 away from the first light-transmissible electrode 21.

Moreover, the first light-transmissible electrode 22 is made of indium tin oxide (ITO), indium zinc oxide (IZO), aluminum zinc oxide (AZO), zinc oxide (ZnO) or tin oxide ($SnO_2$). The light emitting unit 23 is made of silicon carbide (SiC), aluminum oxide ($Al_2O_3$), gallium arsenide (GaAs), gallium phosphide (GaP), indium phosphide (InP), gallium nitride (GaN) or aluminum gallium indium phosphide (AlGaInP). The first connection electrode 24 is made of bismuth, tin, lead, cadmium, nickel, aluminum, silver, gold, metal oxide or organic conductive material.

Please refer to the step S102 and FIG. 5. Then, the light emitting element 20 is installed beside the first surface 111 of the current amplifying element 10. In addition, each light emitting unit 23 is electrically coupled with the corresponding first main electrode 13 through the corresponding first connection electrode 24, and the first light-transmissible electrode 22 is electrically coupled with the at least one first minor electrode 14. In this embodiment, the first light-transmissible electrode 22 is electrically coupled with the at least one first minor electrode 14 through at least one first conductive wire W1.

Please refer to the step S103 and FIG. 4. Then, a light receiving element 30 is provided. The light receiving element 30 comprises a second light-transmissible electrode 32 and the plural light receiving units 33 corresponding to the plural second main electrodes 15. Each light receiving unit 33 comprises a second connection electrode 34. In this embodiment, the light receiving element 30 comprises a second light-transmissible substrate 31, the second light-transmissible electrode 32, the plural light receiving units 33 and the plural second connection electrodes 34. The second light-transmissible substrate 31 has a fifth surface 311 and a sixth surface 312. The fifth surface 311 and the sixth surface 312 are opposed to each other. The second light-transmissible electrode 32 is a multi-layered structure. The second light-transmissible electrode 32 is formed on the fifth surface 311 of the second light-transmissible substrate 31. The light receiving units 33 are formed on the sixth surface 312 of the second light-transmissible substrate 31. Each second connection electrode 34 is formed on a surface of the corresponding light receiving unit 33 away from the second light-transmissible electrode 31.

Moreover, the second light-transmissible electrode 32 is made of indium tin oxide (ITO), indium zinc oxide (IZO), aluminum zinc oxide (AZO), zinc oxide (ZnO) or tin oxide (SnO2). The light receiving unit 33 is made of silicon (Si), gallium arsenide, germanium (Ge), lead sulfide (PbS) or indium gallium arsenide (InGaAs). The second connection electrode 34 is made of bismuth, tin, lead, cadmium, nickel, aluminum, silver, gold, metal oxide or organic conductive material.

Please refer to the step S104 and FIG. 5. Then, the light receiving element 30 is installed beside the second surface 112 of the current amplifying element 10. In addition, each light receiving unit 33 is electrically coupled with the corresponding second main electrode 15 through the corresponding second connection electrode 34, and the second light-transmissible electrode 32 is electrically coupled with the at least one second minor electrode 16. In this embodiment, the second light-transmissible electrode 32 is electrically coupled with the at least one second minor electrode 16 through at least one second conductive wire W2.

After the above steps are completed, the optical amplifying module 1 is manufactured.

Figure 6:
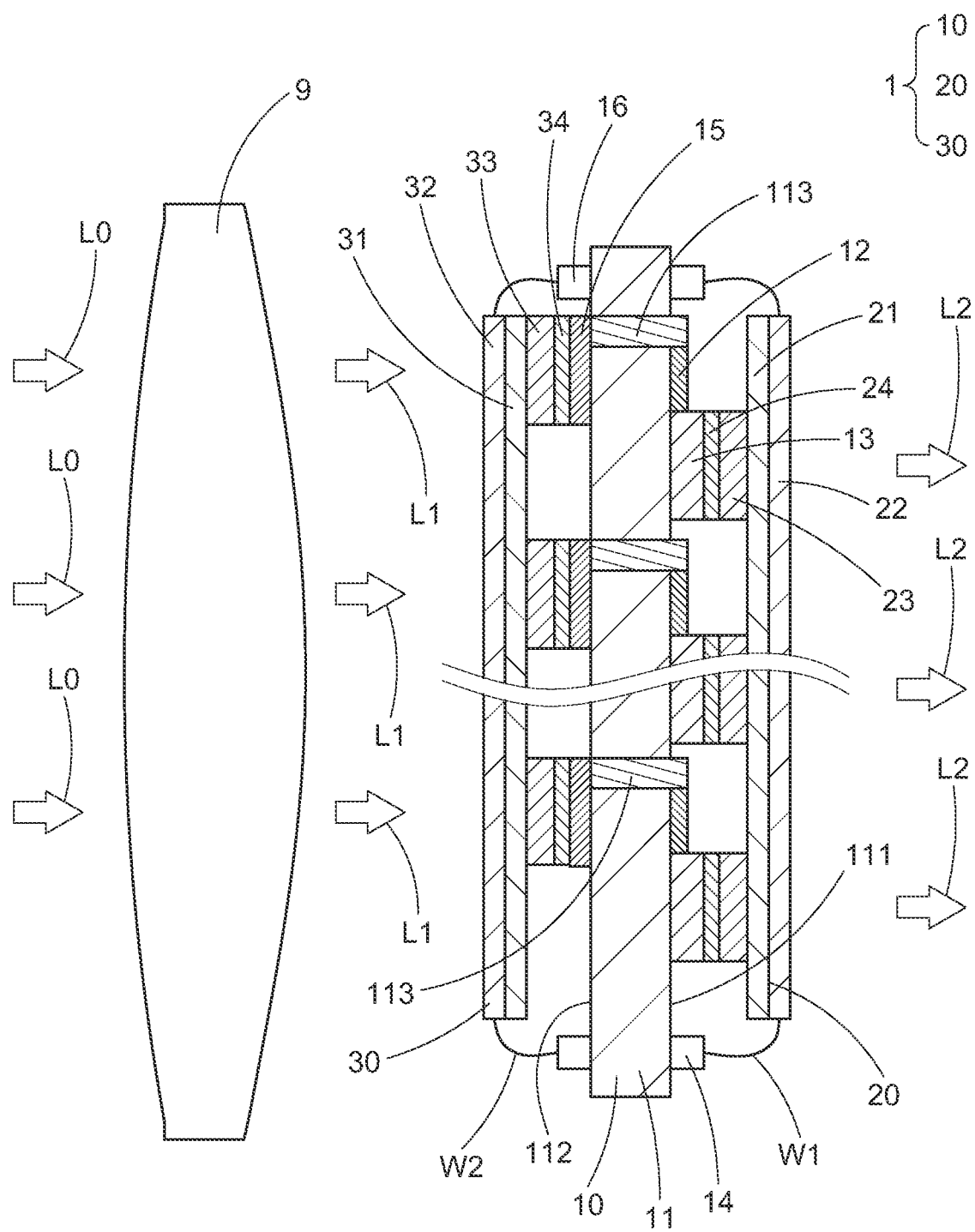
FIG. 6 schematically illustrates the operations of the optical amplifying module according to the embodiment of the present invention.

Please refer to FIG. 6. FIG. 6 schematically illustrates the operations of the optical amplifying module according to the embodiment of the present invention. The optical amplifying module 1 can be installed in a night vision device (not shown). A lens 9 is located beside the light receiving element 30 of the optical amplifying module 1. It is noted that numerous modifications and alterations may be made while retaining the teachings of the invention. For example, in another embodiment, the lens 9 is replaced by a lens group. Moreover, a power source of the night vision device is electrically connected with the main substrate 11 or the first light-transmissible substrate 21 in order to provide electric power to the optical amplifying module 1.

In a dark environment, when the weak ambient light L0 passes through the lens 9, the ambient light L0 is refracted by the lens 9. Consequently, a first light beam L1 is exited from the lens 9. After the first light beam L1 is irradiated on the light receiving element 30, the received light beam is converted into a current signal by the light receiving units 33. The current signal is transmitted to the transistors 12 through the second main electrodes 15 and the inner conductive lines 113. After the transistors 12 receive the current signal, the functional components (e.g., the logic gates or the current amplifier circuits) of the transistors are driven by the electricity from the night vision device. Due to the cooperation of the functional components, the current is amplified by the transistors 12. Afterwards, the amplified current is driven into the light emitting units 23 through the first main electrodes 13. Consequently, the light emitting units 23 emit a second light beam L2 with the stronger intensity.

As mentioned above, the main substrate 11 is a non-transparent substrate. In addition, the first connection electrodes 24 of the light emitting element 20 and the second connection electrodes 34 of the light receiving element 30 are made of metallic material with high reflectivity. Consequently, the working efficiencies of the light receiving element 30 and the light emitting element 20 are both enhanced. Moreover, due to the blocking effect of the metallic material, the second light beam L2 cannot be transmitted through the metallic material. Since the second light beam L2 is not sensed by the light receiving units 33, the erroneous electric signal is not generated. Moreover, the light receiving units 33 are only able to drive the corresponding light emitting units 23. Consequently, if the weak ambient light L0 is imaged on the light receiving element 30 through the lens 9, the ambient light L0 can be converted into the visible light image by the optical amplifying module 1 with the array arrangement. In other words, the second light beam L2 generated by the light emitting element 20 can be formed as the visible light image corresponding to the ambient light L0. The visible light image can be recognized by the user.

From the above descriptions, the present invention provides an optical amplifying module with an image displaying function. The components with three different characteristics (i.e., the characteristics of absorbing, emitting and amplifying the light) are individually produced on different substrates in the array arrangement. Since the manufacturing processes of these components are simple, these components can be tested and produced more easily. After these three components are produced and tested, the array assembly can be completed through two coupling procedures. Since many repetitive assembling procedures are avoided, the yield of the optical amplifying module is increased.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A manufacturing method of an optical amplifying module, the manufacturing method comprising steps of:
   (a) providing a current amplifying element, wherein a main substrate of the current amplifying element has a first surface and a second surface, which are opposed to each other, wherein plural first main electrodes, plural transistors and at least one first minor electrode are installed on the first surface, each transistor is located beside the corresponding first main electrode, and each transistor is electrically connected with the corresponding first main electrode, wherein plural second main electrodes and at least one second minor electrode are installed on the second surface, and each transistor is electrically connected with the corresponding second main electrode through a corresponding inner conductive line;
   (b) providing a light emitting element, wherein the light emitting element comprises a first light-transmissible electrode and plural light emitting units corresponding to the plural first main electrodes, and each light emitting unit comprises a first connection electrode;
   (c) installing the light emitting element beside the first surface of the current amplifying element, wherein the plural light emitting units are electrically coupled with the corresponding first main electrodes through the corresponding first connection electrodes, and the first light-transmissible electrode is electrically coupled with the at least one first minor electrode;
   (d) providing a light receiving element, wherein the light receiving element comprises a second light-transmissible electrode and plural light receiving units corresponding to the plural second main electrodes, and each light emitting receiving unit comprises a second connection electrode; and
   (e) installing the light receiving element beside the second surface of the current amplifying element, wherein the plural light receiving units are electrically coupled with the corresponding second main electrodes through the corresponding second connection electrodes, and the second light-transmissible electrode is electrically coupled with the at least one second minor electrode.

2. The manufacturing method according to claim 1, wherein in the step (b), the light emitting element comprises:
   a first light-transmissible substrate having a third surface and a fourth surface, which are opposed to each other;
   the first light-transmissible electrode formed on the third surface; and
   the plural light emitting units formed on the fourth surface,
   wherein each first connection electrode is formed on a surface of the corresponding light emitting unit away from the first light-transmissible substrate.

3. The manufacturing method according to claim 2, wherein the first light-transmissible electrode is made of indium tin oxide, indium zinc oxide, aluminum zinc oxide, zinc oxide or tin oxide, the light emitting unit is made of silicon carbide, aluminum oxide, gallium arsenide, gallium phosphide, indium phosphide, gallium nitride or aluminum gallium indium phosphide, and the first connection electrode is made of bismuth, tin, lead, cadmium, nickel, aluminum, silver, gold, metal oxide or organic conductive material.

4. The manufacturing method according to claim 1, wherein in the step (d), the light receiving element comprises:
   a second light-transmissible substrate having a fifth surface and a sixth surface, which are opposed to each other;
   the second light-transmissible electrode formed on the fifth surface; and
   the plural light receiving units formed on the sixth surface,
   wherein each second connection electrode is formed on a surface of the corresponding light receiving unit away from the second light-transmissible substrate.

5. The manufacturing method according to claim 4, wherein the second light-transmissible electrode is made of indium tin oxide, indium zinc oxide, aluminum zinc oxide, zinc oxide or tin oxide, the light receiving unit is made of silicon, gallium arsenide, germanium, lead sulfide or indium gallium arsenide, and the second connection electrode is made of bismuth, tin, lead, cadmium, nickel, aluminum, silver, gold, metal oxide or organic conductive material.

6. The manufacturing method according to claim 1, wherein in the step (c), the first light-transmissible electrode is electrically coupled with the at least one first minor electrode through at least one first conductive wire.

7. The manufacturing method according to claim 1, wherein in the step (e), the second light-transmissible electrode is electrically coupled with the at least one second minor electrode through at least one second conductive wire.

8. An optical amplifying module, comprising:
a current amplifying element, wherein a main substrate of the current amplifying element has a first surface and a second surface, which are opposed to each other, wherein plural first main electrodes, plural transistors and at least one first minor electrode are installed on the first surface, each transistor is located beside the corresponding first main electrode, and each transistor is electrically connected with the corresponding first main electrode, wherein plural second main electrodes and at least one second minor electrode are installed on the second surface, and each transistor is electrically connected with the corresponding second main electrode through a corresponding inner conductive line;
a light emitting element installed beside the first surface of the current amplifying element, wherein the light emitting element comprises a first light-transmissible electrode and plural light emitting units corresponding to the plural first main electrodes, and each light emitting unit comprises a first connection electrode, wherein the plural light emitting units are electrically coupled with the corresponding first main electrodes through the corresponding first connection electrodes, and the first light-transmissible electrode is electrically coupled with the at least one first minor electrode through at least one first conductive wire; and
a light receiving element installed beside the second surface of the current amplifying element, wherein the light receiving element comprises a second light-transmissible electrode and plural light receiving units corresponding to the plural second main electrodes, and each light emitting receiving unit comprises a second connection electrode, wherein the plural light receiving units are electrically coupled with the corresponding second main electrodes through the corresponding second connection electrodes, and the second light-transmissible electrode is electrically coupled with the at least one second minor electrode through at least one second conductive wire.

9. The optical amplifying module according to claim 8, wherein the light emitting element comprises:

a first light-transmissible substrate having a third surface and a fourth surface, which are opposed to each other;
the first light-transmissible electrode formed on the third surface; and
the plural light emitting units formed on the fourth surface,
wherein each first connection electrode is formed on a surface of the corresponding light emitting unit away from the first light-transmissible substrate.

10. The optical amplifying module according to claim 9, wherein the first light-transmissible electrode is made of indium tin oxide, indium zinc oxide, aluminum zinc oxide, zinc oxide or tin oxide, the light emitting unit is made of silicon carbide, aluminum oxide, gallium arsenide, gallium phosphide, indium phosphide, gallium nitride or aluminum gallium indium phosphide, and the first connection electrode is made of bismuth, tin, lead, cadmium, nickel, aluminum, silver, gold, metal oxide or organic conductive material.

11. The optical amplifying module according to claim 8, wherein the light receiving element comprises:

a second light-transmissible substrate having a fifth surface and a sixth surface, which are opposed to each other;
the second light-transmissible electrode formed on the fifth surface; and
the plural light receiving units formed on the sixth surface,
wherein each second connection electrode is formed on a surface of the corresponding light receiving unit away from the second light-transmissible substrate.

12. The optical amplifying module according to claim 11, wherein the second light-transmissible electrode is made of indium tin oxide, indium zinc oxide, aluminum zinc oxide, zinc oxide or tin oxide, the light receiving unit is made of silicon, gallium arsenide, germanium, lead sulfide or indium gallium arsenide, and the second connection electrode is made of bismuth, tin, lead, cadmium, nickel, aluminum, silver, gold, metal oxide or organic conductive material.

* * * * *